United States Patent [19]

Asano

[11] Patent Number: 5,552,127
[45] Date of Patent: Sep. 3, 1996

[54] BIOLOGICAL MACROMOLECULAR SUBSTANCES CRYSTALLIZATION APPARATUS

[75] Inventor: Koji Asano, Kawasaki, Japan

[73] Assignee: Fujitsu, Ltd., Kanagawa, Japan

[21] Appl. No.: 433,708

[22] Filed: May 2, 1995

[30] Foreign Application Priority Data

Jul. 25, 1994 [JP] Japan .................................... 6-172436

[51] Int. Cl.⁶ .................................................... B01D 9/02
[52] U.S. Cl. ...................... 422/245.1; 117/201; 117/202; 422/81; 422/99
[58] Field of Search ..................................... 117/200, 201, 117/202, 209, 901, 902; 422/80, 81, 99, 245.1

[56] References Cited

U.S. PATENT DOCUMENTS

| | | | |
|---|---|---|---|
| 4,960,572 | 10/1990 | Littke et al. ............................... | 117/901 |
| 5,081,043 | 1/1992 | Jacob ......................................... | 422/80 |
| 5,082,635 | 1/1992 | Wakatsuki et al. ........................ | 422/99 |
| 5,106,592 | 4/1992 | Stapelmann et al. .................... | 117/901 |
| 5,266,284 | 11/1993 | Heliz et al. ............................... | 117/901 |

OTHER PUBLICATIONS

Journal of Crystal Growth, vol. 110, (1991) pp. 312–316; "Des. of Apparatus and Experiments . . . using the MIR Spacestation", Barry L. Stoddard et al.

Primary Examiner—Felisa C. Garrett
Attorney, Agent, or Firm—Armstrong, Westerman, Hattori, McLeland & Naughton

[57] ABSTRACT

A biological macromolecular substances crystallization apparatus comprises a plate-like base, a lid having a concavity which defines an experimental vessel for crystallizing biological macromolecular substances when the lid is put on the base, a groove formed in the base of the experimental vessel for holding a first specimen solution for crystallizing biological macromolecular substances, a trench-like groove formed in the base of the experimental vessel for holding a second specimen solution for crystallizing biological macromolecular substances, tight sealing means for tightly closing the experimental vessel, a plug which is provided in the concavity in the lid, and which is pressed to cover said grooves and to separate said groove from said trench-like groove, and a valve which is provided in the concavity in the lid, and which equalizes an internal pressure in the experimental vessel to an external pressure. Because of the valve for equalizing internal pressure of the experimental vessel to an external pressure, even when volume of the interior of the experimental vessel greatly vary between on standby and in experiments, leakage of the solutions loaded in the apparatus can be suppressed.

7 Claims, 4 Drawing Sheets

BIOLOGICAL MACROMOLECULAR SUBSTANCES CRYSTALLIZATION APPARATUS

BACKGROUND OF THE INVENTION

The present invention relates to an experimental technique in microgravity environments, such as space, and more specifically to a crystallization apparatus for crystallizing biological macromolecular substances such as proteins, enzymes etc.

Recently, space environments have been increasingly tried as sites for growing various crystals and production of new materials, such as semiconductors, alloys, biomaterials, etc. Experiments in crystallization of biological substances are one type of experiment increasingly expected to be performed in space. However, biological substances crystallization experiments have such poor repeatability that a plurality of experiments using the same composition and under the same conditions must be conducted.

However, space experiments not only incur costs of transportation to space, but also opportunities to perform them are limited. Furthermore, in experiments in unmanned artificial satellites, the apparatuses must be totally automated. Even in experiments in manned satellites, the time and labor that crews can allot for the experiments are very limited. In view of this, experimental apparatuses which can conduct a plurality of experiments concurrently and that have high reliability are required.

As a conventional biological macromolecular substances crystallization apparatus, an experimental apparatus made by U.S. Payload Systems Inc. (PSI) for growing crystals by vapor diffusion method is known (FIG. 4).

The PSI biological macromolecular substances crystallization apparatus comprises a plate-shaped base 10 of polymethyl pentene, which does not react with water and macromolecular materials, and a block-shaped lid 12. In the base 10 there are provided cylindrical grooves 14, and trench-like grooves 16 around the cylindrical grooves 14. In the lid 12 there are provided screw plugs 18 which shut a biological macromolecular substances solution A off from a crystallizing agent solution B when the experiments are in the stand-by state. Rubber members 20 for tight sealing the cylindrical grooves 14 are provided on one end of the plugs 18. O-rings 22 are provided between the base 10 and the lid 12 and on the plugs 18 respectively for tight sealing the interior of the apparatus with respect to the outside (FIG. 4).

A plurality of such experimental vessels are formed in the base 10 in one-piece therewith. Experiments can be concurrently conducted under different conditions.

In an experiment, a biological macromolecular substances solution A, comprising a protein and neutral salt, is loaded in a cylindrical groove 14 and a crystallizing agent solution B, containing neutral salt of a high concentration and/or organic material is loaded in a trench-like groove 16. In storage, and during standby and launch, the cylindrical groove 14 is tightly sealed at the top by the plug 18 so as to keep the solutions inert and prevent spilling the solutions (FIG. 4, left side). In the experiment, the plug 18 is loosened to allow crystal growth by vapor diffusion (FIG. 4, right side).

An advantage of the PSI apparatus is that the shape of the crystallization vessel is very similar to that of laboratory crystallization vessels used on the earth. Before a space experiment, it is necessary to conduct pre-experiments to determine conditions for the space experiment. However, an advantage of the PSI apparatus is that the shape of the crystallization vessel is similar to those used in laboratories on earth. Because of this similarity of shapes, not so many pre-experiments are necessary. This advantage is not found in other prior art apparatuses.

However, the above-described conventional biological macromolecular substances crystallization apparatus has the problem that because the volume of the interior of the apparatus changes greatly between before and after an experiment, there are risks that the solutions in one experimental vessel may leak into an adjacent one and water may intrude into the experimental vessels from the outside. As a result, the internal pressure of the vessels adversely becomes different from that in an experiment on earth, so that experimental results, such as crystal growth rates, etc., are affected.

A common disadvantage of apparatuses for use in vapor diffusion is that if the vessels are subject to vibrations, specimen solutions are splashed due to gas-liquid interfaces which freely vibrate.

Furthermore, in the above-described biological macromolecular substances crystallization apparatus, although a plurality of experimental vessels are formed in the base in one-piece therewith, the respective vessels are not independent within the tight sealing unit. When specimens of different kinds or specimens of different solution compositions are loaded in the vessels, there is a risk that different specimen solutions may be mixed with one another. In addition, when specimens are loaded into the vessels, or specimens in the vessels are analyzed, inconveniently the common lid is opened, and all the vessels are concurrently exposed.

SUMMARY OF THE INVENTION

An object of the present invention is to provide a biological macromolecular substances crystallization apparatus having high reliability in which the internal pressure of the experimental vessels does not change during standby and during operation, specimen solutions are not splashed, respective vessels are air-tight, and a plurality of experiments can be concurrently conducted.

The above-described object is achieved by a biological macromolecular substances crystallization apparatus which comprises a plate-like base, a lid having a concavity which defines an experimental vessel for crystallizing biological macromolecular substances when the lid is put on the base, a groove formed in the base of the experimental vessel for holding a first specimen solution for crystallizing biological macromolecular substances, a trench-like groove formed in the base of the experimental vessel for holding a second specimen solution for crystallizing biological macromolecular substances, tight sealing means for tightly sealing the experimental vessel, a plug which is provided in the concavity in the lid, and which is pressed to cover said grooves and to separate said groove from said trench-like groove; and a valve which is provided in the concavity in the lid, and which equalizes an internal pressure in the experimental vessel to an external pressure.

The above-described object is achieved by a biological macromolecular substances crystallization apparatus which comprises a plate-like base, a lid having a concavity which defines an experimental vessel for crystallizing biological macromolecular substances when the lid is put on the base, a groove formed in the base of the experimental vessel for holding a first specimen solution for crystallizing biological macromolecular substances, a trench-like groove formed in the base of the experimental vessel for holding a second specimen solution for crystallizing biological macromolecular substances, a dialysis film provided on the base for covering the groove, tight sealing means for tightly sealing the experimental vessel, and a plug which is provided in the concavity in the lid, and which is pressed to cover said groove and separates said groove from said trench-like groove.

The above-described object is achieved by a biological macromolecular substances crystallization apparatus which comprises a plate-like base, a lid having a plurality of concavities which define experimental vessels for crystallizing biological macromolecular substances when the lid is put on the base, a plurality of grooves which are formed in the base of the respective experimental vessel for holding a first specimen solution for crystallizing biological macromolecular substances, a plurality of trench-like grooves which are formed in the base of the respective experimental vessel for holding a second specimen solution for crystallizing biological macromolecular substances, a plurality of plugs which are provided in the respective concavities in the lid, and which are pressed to cover said grooves and to separate said grooves from said trench-like grooves, and tight sealing means for respectively sealing tightly said plurality of experimental vessels.

It is preferable that the above-described biological macromolecular substances crystallization apparatus further comprises a plurality of valves provided in the respective concavities in the lid for equalizing internal pressures of the experimental vessels with an external pressure.

It is preferable that the above-described biological macromolecular substances crystallization apparatus further comprises dialysis films provided on the base for covering the grooves.

According to the present invention, there is provided a valve which equalizes an internal pressure of the apparatus to an external pressure, so that even when an internal volume of an apparatus varies between standby and operation, leakage of solutions within the apparatus can be eliminated. In addition, because internal pressures of the apparatus can be made substantially equal to those of the experiments in laboratories, the influence of pressure variations on experiment results, such as variations of crystal growth rates, can be suppressed.

Because the groove for holding biological macromolecular substances solutions is covered with the dialysis film for preventing leakage of the solutions due to vibrations, crews who conduct experiments can easily handle the apparatus, open and close the plugs and valves thus starting and completing experiments, and the apparatus can have higher reliability.

In the biological macromolecular substances crystallization apparatus, a plurality of experimental vessels are formed in one-piece, but for improving the tight closure of the respective experimental vessels, O-rings are additionally provided between each experimental vessel and its adjacent one, so that even when specimens of different kinds are loaded, or when specimen solutions of different compositions are loaded, the specimen solutions can be kept from mixing with one another. In addition, as described latter when specimens are loaded or analyzed, the respective experimental vessels can be individually handled.

DETAILED DESCRIPTION OF THE PREFERRED EMBODIMENTS

The biological macromolecular substances crystallization apparatus according to the embodiment of the present invention will be explained with reference to FIGS. 1A to 3.

Figure 1A:
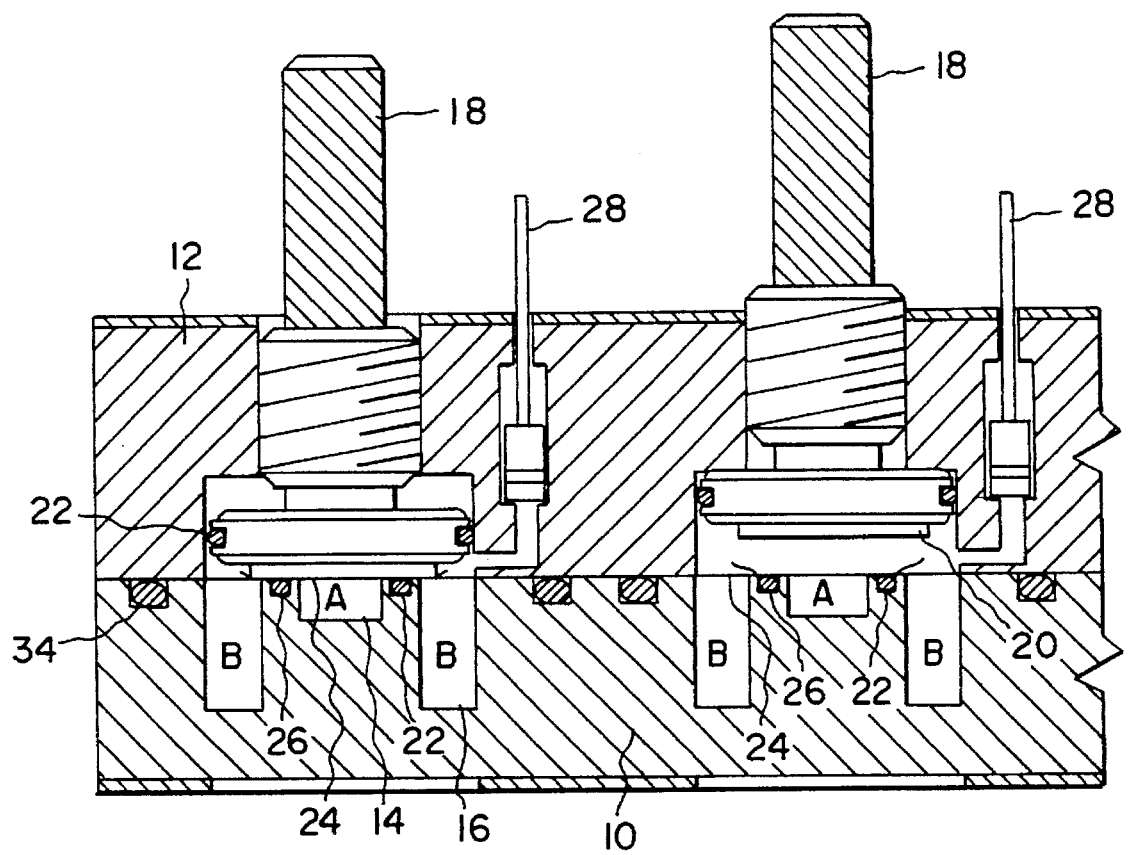
FIG. 1A is a diagrammatic sectional view of the biological macromolecular substances crystallization apparatus according to the embodiment of the present invention.
Figure 1B:
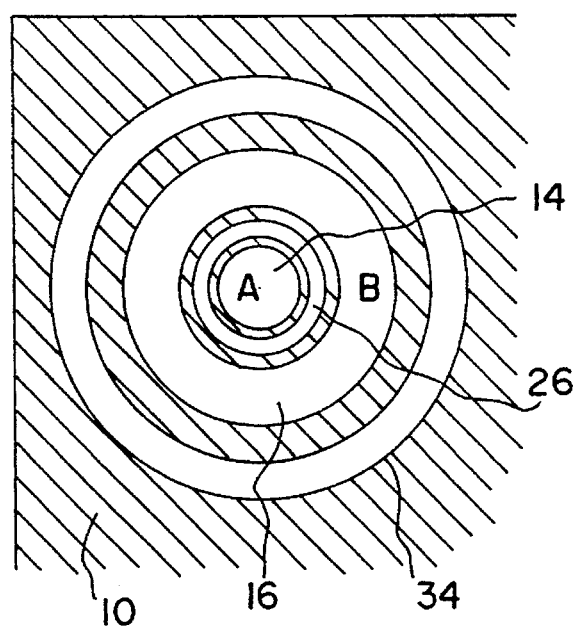
FIG. 1B is a diagrammatic plan view of the biological macromolecular substances crystallization apparatus of FIG. 1A.
Figure 2:
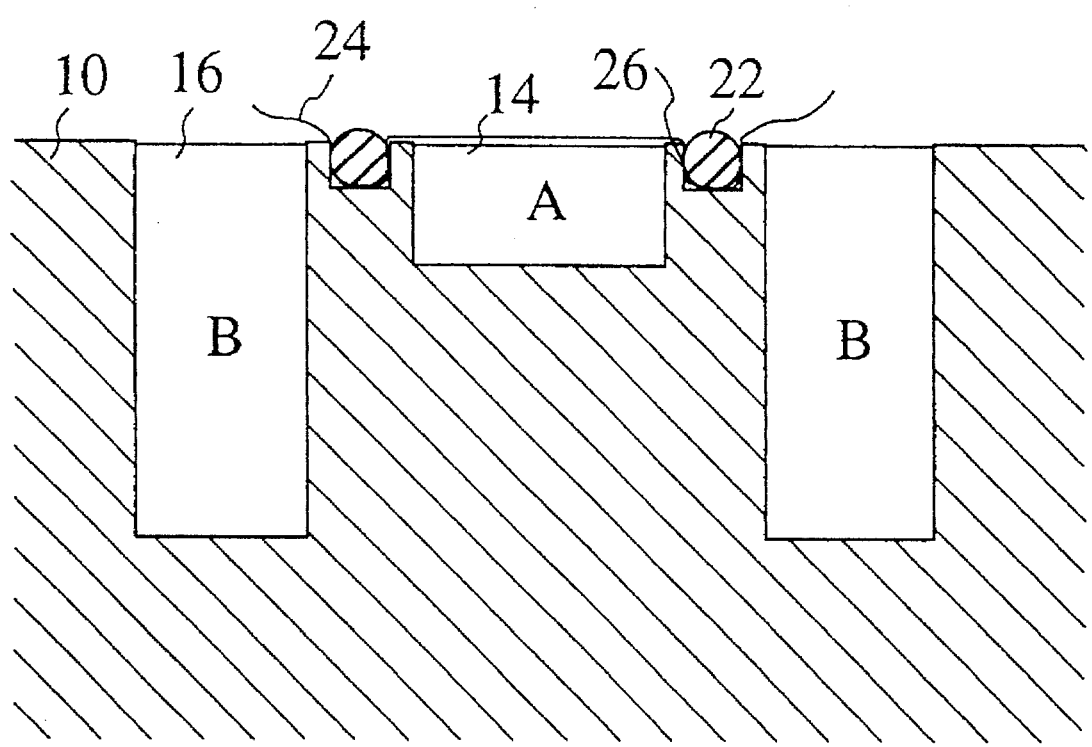
FIG. 2 is an enlarged detailed view of the biological macromolecular substances crystallization apparatus of FIG. 1A.
Figure 3:
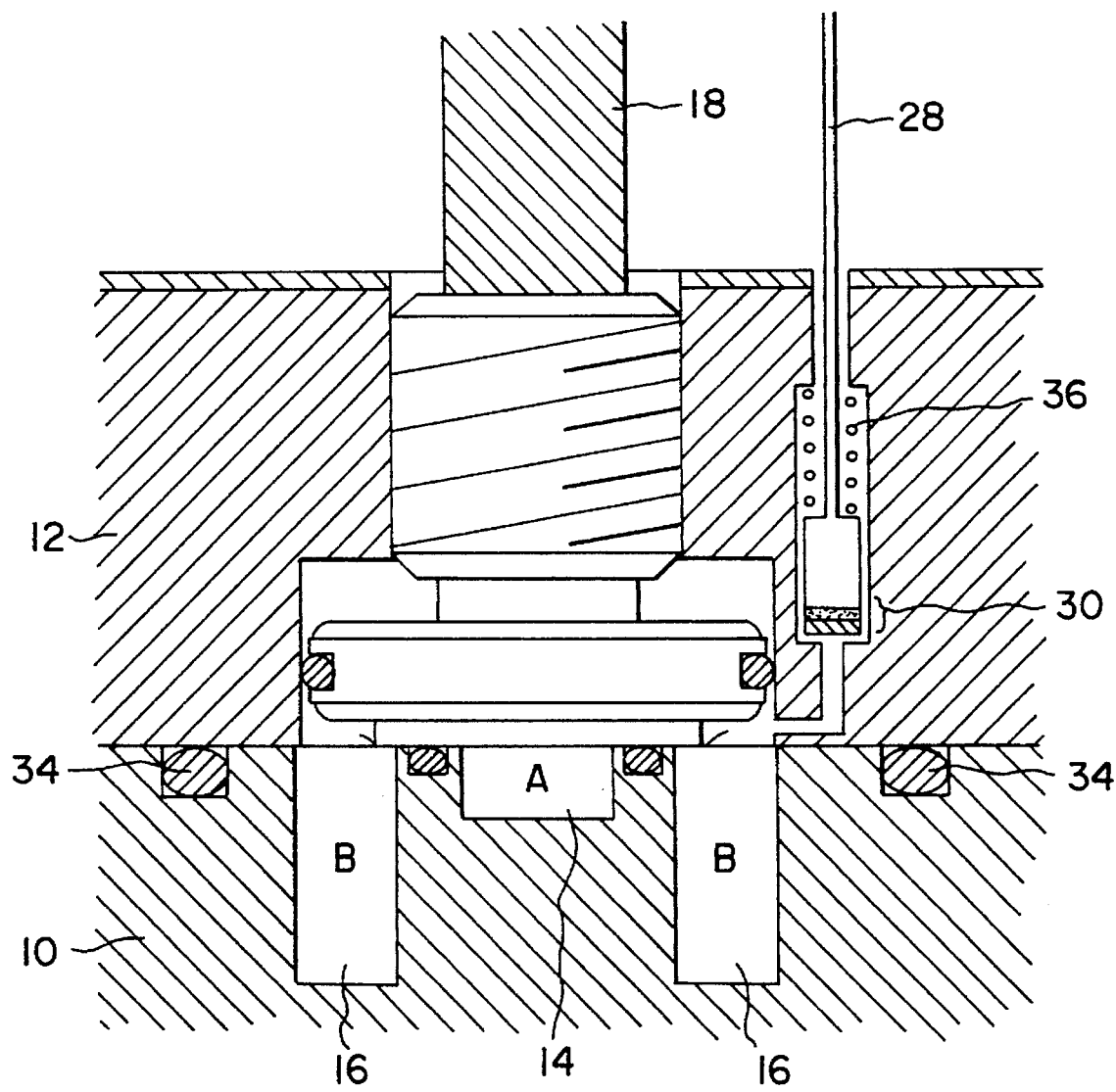
FIG. 3 is an enlarged detailed view of the biological macromolecular substances crystallization apparatus of FIG. 1A.
Figure 4:
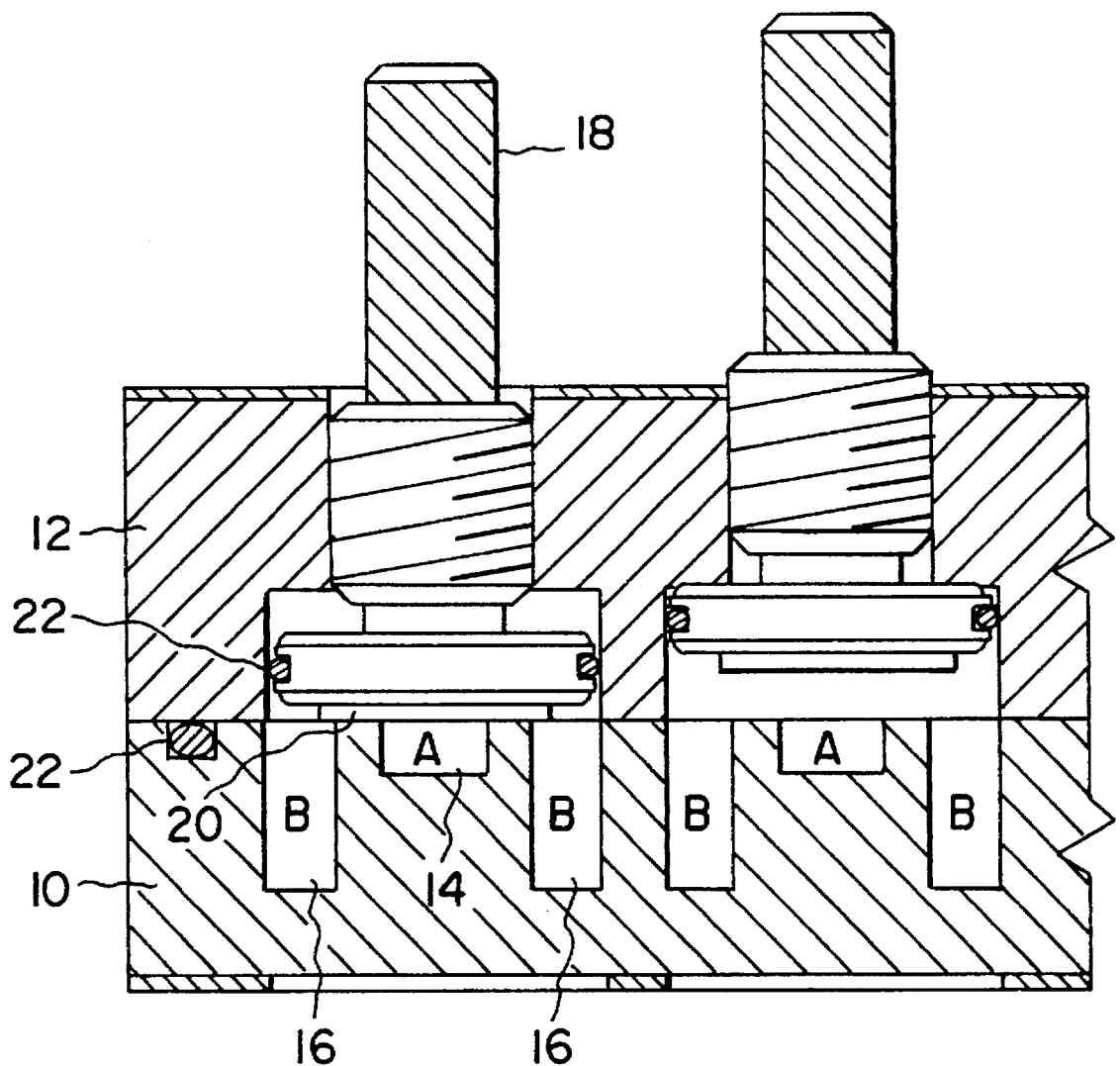
FIG. 4 is a diagrammatic view of a conventional biological macromolecular substances crystallization apparatus.

FIGS. 1A and 1B are diagrammatic sectional and plan views of the biological macromolecular substances crystallization apparatus according to the embodiment of the present invention. FIGS. 2 and 3 are enlarged partial sectional views of the biological macromolecular substances crystallization apparatus shown in FIG. 1A.

The biological macromolecular substances crystallization apparatus according to the present embodiment comprises a plate-like base 10 of polycarbonate, which does not react with water and macromolecular material, and a block-like lid 12 (FIG. 1A).

As shown in FIG. 1B, the base 10 has cylindrical grooves 14 into which a biological macromolecular substances solution A (e.g. aqueous solution) comprising biological macromolecular substances and salt and/or organic material is loaded. Trench-like grooves 16 into which a crystallization agent solution B (e.g. aqueous solution), containing salt of a high concentration and/or organic material, is loaded are formed around each of the grooves 14.

As the salt, sulfate salt (e.g. ammonium sulfate), chloride salt (e.g. sodium chloride, cesium chloride), phosphate salt (e.g. potassium dihydrogenphosphate), carbonate salt (e.g. sodium hidrogencarbonate), and others, may be used. As the organic solvent, alcohol (e.g. ethanol, methanol, and methyl pentane diol), ketone e.g. acetone), dioxane (e.g. 1,4-dioxane), polyethyleneglycol, and benzene, and others, may be used.

Buffer substance may be added in the specimen solution to keep hydronium ion concentration of the specimen solution constant. Surfactant such as Triton-X, cholic acid, and others, may be added in the specimen solution to dissolve the biological macromolecular substances in the solvent, and to stabilize the balance of osmotic pressure between the solution A and the solution B.

As shown in FIG. 2, the cylindrical grooves 14 are covered with dialysis films 24 to prevent the biological macromolecular substances solution from splashing due to vibration and is secured by O-rings 22 in grooves 26.

In the lid 12 there are provided screw-plugs 18 for shutting biological macromolecular substances solution A off from crystallizing agent solution B during standby for an experiment. A rubber 20 is provided on the end of each plug 18 for air-tightly sealing the cylindrical groove 14. O-rings 34, 22 are provided respectively between the base 10 and the lid 12 and on each plug 18 for air-tightly sealing the interior of the apparatus with respect to the outside or each experimental vessel with respect to the rest of the experimental vessels.

Valves 28 are provided in the lid 12 for equalizing pressures in the apparatus between standby and operation. As shown in FIG. 3, each valve 28 is normally closed, pressed by a spring 36. The valve 28 is pulled against the spring 36 to define a gas passage so as to equalize the internal pressure of each vessel with an external pressure. On the forward end of the valve 28 there is provided a rubber 30 for air-tight closure. The rubber 30 may be chemically inert to the biological macromolecular substances.

Next, the operation of the biological macromolecular substances crystallization apparatus according to the embodiment will be explained.

First, the lid 12 is opened to load the cylindrical groove 14 with a biological macromolecular substances solution A and the trench-like groove 16 with a crystallization agent solution B, the top of the cylindrical groove 14 is covered with the transparent dialysis film 24, and the dialysis film 24 is fixed by the O-ring 22 in groove 26 (FIG. 2). Then, the lid 12 is tightly closed by bolts, for example, inserting and tightening through bolt holes conveniently provided through the lid 12 and the base 10. The plugs 18 are screwed shut, whereby the biological macromolecular substances solution A and the crystallization agent solution B in the apparatus are separated from each other. The apparatus is stored, handled and is launched in this state (FIG. 1A, left side).

In an experiment, first the plug 18 is disengaged to put the apparatus in a state which enables crystallization by vapor diffusion method (FIG. 1A, right side). Then, because the internal pressure is decreased by opening the plug 18, the valve 28 is slowly lifted immediately after the plug 18 has been removed to equalizing the internal pressure with the external pressure. Thus, the experiment can be conducted under conditions similar to on the earth.

In this state the biological macromolecular substances are crystallized by vapor diffusion, and when the experiment is over, the plug 18 is put in.

When analyses are made after the experiment is over, because the respective experimental vessels are separated from each other by the O-rings 34, the vessels can be individually separated for analyses by cutting using conventional means.

Thus, according to the present embodiment, owing to the valves 28, which equalize internal pressures of the experimental vessels during standby to those of the experimental vessels in operation.

The grooves 14 for the biological macromolecular substances solution A to be held in are covered with dialysis films 24, whereby leakage of the solution due to vibrations can be prevented.

The biological macromolecular substances crystallization apparatus according to the present embodiment has a plurality of experimental vessels formed in one-piece, but for improvement of tight-closure of the respective experimental vessels, O-rings 34 are additionally provided between each experimental vessel and its adjacent one, so that when specimens of different kinds are loaded, or when specimen solutions of different compositions are loaded, the specimen solutions can be kept from mixing with one another.

The present invention includes other modifications and variations in addition to the above-described embodiment.

For example, in the above-described embodiment, the macromolecular substances crystallization apparatus is applicable to the crystallization of the biological macromolecular substances, such as protein, enzyme, enzyme-inhibitor complex, enzyme-substrate analog complex, antigen, antigen-antibody complex, nucleic acid, polypeptide, membrane protein, and others.

In the above-described embodiment, the base and the lid are made of polycarbonate but they may be made of any other materials which do not react with the solvent, contained agents, and biological macromolecular materials. For example, glass, and transparent plastics, such as polymethyl methacrylate and polymethyl pentene, etc., may be used. To permit the interior of the apparatus to be observed during crystal growth, it is preferred that these materials be transparent.

It is preferred that the rubber 30, etc., for shutting the biological macromolecular substances solution A off from the crystallization agent solution B, which directly contacts the biological macromolecular substances solution A, be silicone and/or fluoro-silicone rubber, which does not react with the biological macromolecule solution A.

What is claimed is:

1. A biological macromolecular substances crystallization apparatus comprising:

a plate-like base;

a lid having a concavity which defines an experimental vessel for crystallizing biological macromolecular substances when the lid is put on the base;

a groove formed in the base of the experimental vessel for holding a first specimen solution for crystallizing the biological macromolecular substances;

a trench-like groove formed in the base of the experimental vessel for holding a second specimen solution for crystallizing the biological macromolecular substances;

tight sealing means for tightly sealing the experimental vessel;

a plug which is provided in the concavity in the lid, and which is pressed to cover said groove and to separate said groove from said trench-like groove; and a valve which is provided in the concavity in the lid, and which equalizes an internal pressure in the experimental vessel to an external pressure.

2. A biological macromolecular substances crystallization apparatus according to claim 1, further comprising a dialysis film provided on the base for covering the groove.

3. A biological macromolecular substances crystallization apparatus comprising:

a plate-like base;

a lid having a concavity which defines an experimental vessel for crystallizing biological macromolecular substances when the lid is put on the base;

a groove formed in the base of the experimental vessel for holding a first specimen solution for crystallizing the biological macromolecular substances;

a trench-like groove formed in the base of the experimental vessel for holding a second specimen solution for crystallizing the biological macromolecular substances;

a dialysis film provided on the base for covering the groove;

tight sealing means for tightly sealing the experimental vessel; and a plug which is provided in the concavity in the lid, and which is pressed to cover said groove and to separate said groove from said trench-like groove.

4. A biological macromolecular substances crystallization apparatus comprising:

a plate-like base;

a lid having a plurality of concavities which define experimental vessels for crystallizing biological macromolecular substances when the lid is put on the base;

a plurality of grooves which are formed in the base of the respective experimental vessels for holding a first specimen solution for crystallizing the biological macromolecular substances;

a plurality of trench-like grooves which are formed in the base of the respective experimental vessels for holding a second specimen solution for crystallizing the biological macromolecular substances;

a plurality of plugs which are provided in the respective concavities in the lid, and which are pressed to cover said grooves and to separate said grooves from said trench-like grooves;

tight sealing means for respectively sealing tight said plurality of experimental vessels.

5. A biological macromolecular substances crystallization apparatus according to claim 4, further comprising a plurality of valves provided in the respective concavities in the lid for equalizing internal pressures of the experimental vessels to an external pressure.

6. A biological macromolecular substances crystallization apparatus according to claim 5, further comprising dialysis films provided on the base for covering the respective grooves.

7. A biological macromolecular substances crystallization apparatus according to claim 4, further comprising dialysis films provided on the base for covering the respective grooves.

* * * * *